United States Patent [19]
Matsuoka et al.

[11] Patent Number: 5,557,117
[45] Date of Patent: Sep. 17, 1996

[54] HETEROJUNCTION BIPOLAR TRANSISTOR AND INTEGRATED CIRCUIT DEVICE USING THE SAME

[75] Inventors: Yutaka Matsuoka; Eiichi Sano; Kenji Kurishima; Hiroki Nakajima; Tadao Ishibashi, all of Kanagawa, Japan

[73] Assignee: Nippon Telegraph and Telephone Corporation, Tokyo, Japan

[21] Appl. No.: 241,189

[22] Filed: May 11, 1994

[30] Foreign Application Priority Data

May 12, 1993 [JP] Japan ................................. 5-132371

[51] Int. Cl.[6] .............................................. H01L 31/0328
[52] U.S. Cl. ........................... 257/184; 257/187; 257/198
[58] Field of Search .................................... 257/197, 198, 257/26, 184, 186, 187

[56] References Cited

U.S. PATENT DOCUMENTS

| 5,019,890 | 5/1992 | Ishibashi et al. |
| 5,150,185 | 9/1992 | Yamada. |
| 5,401,999 | 3/1995 | Bayraktaroglu .......................... 257/198 |

FOREIGN PATENT DOCUMENTS

| 4-127534 | 4/1992 | Japan. |
| 4-221834 | 8/1992 | Japan. |
| 4-245439 | 9/1992 | Japan. |

OTHER PUBLICATIONS

K. D. Pedrotti et al., "Monolithic ultrahigh-speed GaAs HBT optical integrated receivers", Tsch, Dig. 1991 GaAs IC symp., pp. 205–208.

K. Kurishima et al., "High–speed InP/InGaAs double–heterostructure bipolar transistors with suppressed collector current blocking", Appl. Phys. Lett. 62 (19), 10 May 1993, pp. 2372–2374.

Sixth International Conference on Indium Phosphide and Related Materials, Mar. 27–31, 1994, Sponsored by the IEEE Lasers and Electro–Optics Society et al., "Novel InP/InGaAs Double–Heterojunction Bipolar Transistors Suitable for High–Speed IC's and OEIC's" by Yutaka Matsuoka et al., pp. 555–558.

Primary Examiner—Jerome Jackson, Jr.
Assistant Examiner—Courtney A. Bowers
Attorney, Agent, or Firm—Blakely, Sokoloff, Taylor & Zafman

[57] ABSTRACT

A heterojunction bipolar transistor includes a collector contact layer constituted by a high-concentration first semiconductor layer of a first conductivity type formed on a semiconductor substrate, a collector region stacked on the collector contact layer, a base layer constituted by a fifth semiconductor layer of a second conductivity type formed on the collector region, and an emitter layer constituted by a semiconductor layer of the first conductivity type formed on the base layer. The collector region is constituted by a second semiconductor layer, a third semiconductor layer of the second conductivity type having an impurity concentration higher than that of the second semiconductor layer, and a fourth semiconductor layer of the first conductivity type having a band gap energy higher than that of each of the first and second semiconductor layers and an impurity concentration higher than that of the second semiconductor layer, and the fourth semiconductor layer and lower than that of the first semiconductor layer, the third semiconductor layer, and the second semiconductor layer are sequentially formed on the collector contact layer in an order named.

1 Claim, 6 Drawing Sheets

HETEROJUNCTION BIPOLAR TRANSISTOR AND INTEGRATED CIRCUIT DEVICE USING THE SAME

BACKGROUND OF THE INVENTION

The present invention relates to a heterojunction bipolar transistor and an integrated circuit device such as a photoreceiver opto-electro integrated circuit comprising the heterojunction bipolar transistors and a pin photodiode.

In the heterojunction bipolar transistor, the emitter has a wider band gap than that of a base layer, so emitter injection efficiency can be advantageously kept high even when the impurity concentration of the base layer is high. In addition, the heterojunction bipolar transistor can be operated at a speed higher than that of a homojunction bipolar transistor because of the excellent electron transport properties of the compound semiconductor used in the base and/or collector layers. One of the typical examples of this type of transistors is an npn-InP/InGaAs-based heterojunction bipolar transistor.

FIGS. 3A and 3B respectively show the energy band diagram and layer structure of a conventional InP/InGaAs heterojunction bipolar transistor.

This heterojunction bipolar transistor is constituted by an InGaAs collector contact layer 52 containing a high-concentration n-type impurity formed on a semi-insulating InP substrate, an InGaAs collector layer 57 containing a low-concentration n-type impurity, an InGaAs base layer 58 containing a high-concentration p-type impurity, an InP emitter layer 59 containing an n-type impurity, and an InGaAs emitter contact layer 60 containing a high-concentration n-type impurity.

A collector electrode, a base electrode, and an emitter electrode are formed on the collector contact layer 52, the base layer 58, and the emitter contact layer 60, respectively, and each of these electrodes consists of Ti/Pt/Au.

Since this structure uses InP as the emitter layer 59, which has a band gap wider than that of the base layer 58, emitter injection efficiency can be kept high even at a high doping concentration of the base layer. In addition, due to the excellent electron transport properties of, InGaAs, the transistor can operate at a high-speed speed.

In a heterojunction bipolar transistor, it is important to decrease transit time of electrons in the collector to increase the operation speed. As one of structures for realizing this, a collector structure of ballistic collection transistor (to be referred to as a BCT hereinafter) has been proposed (T. Ishibashi and Y. Yamauchi, "A possible near-ballistic collection in AlGaAs/GaAs HBT with a modified collector structure, "IEEE Trans. Electron Devices, vol. 35, pp. 401–404, 1988).

As shown in FIGS. 5A and 5B, a collector layer 57 of the InP/InGaAs BCT structure is constituted by an undoped InGaAs layer 57b, an InGaAs layer 57c containing a p-type impurity at a high concentration, and an InGaAs layer 57d containing an n-type impurity at a high concentration. The same reference numerals as in FIG. 3B denote the same parts in FIG. 5B.

The InGaAs layer 57c and the InGaAs layer 57d constitute a p-n junction to form a potential cliff near the interface between the collector and the collector contact layer.

This potential cliff reduces the potential change in the collector layer 57b, and suppresses the transition of electrons passing through the collector layer 57b from T-valley to L-valley. As a result, the transit time of electrons in a collector is shortened to decrease the operation time of the transistor.

However, the heterojunction bipolar transistors shown in FIGS. 3A, 3B, 5A, and 5B have a low collector breakdown voltage because a strong electric field is applied to a semiconductor with a low band gap energy located near the interface between the collector and the collector contact layer.

The situation is very severe especially in the heterojunction bipolar transistor using InGaAs as the material of the collector, which has a band gap energy of the InGaAs is as low as 0.76 eV.

When the emitter is grounded, and collector current density is increased, the collector breakdown voltage becomes very low due to the high ionization coefficient.

In addition, in the BCT structure, a steeper potential change is produced near the interface between the collector layer and the collector contact layer to make the problem of the breakdown voltage more serious in a transistor using an InP/InGaAs-based material.

FIG. 4 shows a structure of a photoreceiver opto-electro integrated circuit is constituted by conventional heterojunction bipolar transistors and a Pin photodiode which uses the same layers as the base layer 58, the collector layer 57, and the collector contact layer 52 of the above heterojunction bipolar transistor. This structure is described in, for example, K. D. Pedrotti, N. H. Sheng, R. L. Pierson, Jr., C. W. Farley, M. J. Rosker and M. F. Chang, "Monolithic ultrahigh-speed GaAs HBT optical integrated receivers", Tsch. Dig. 1991 GaAs IC symp., pp. 205–208.

The same reference numerals as in FIGS. 3A and 3B denote the same parts in FIG. 4. In FIG. 4, reference numeral 51 denotes a semi-insulating InP substrate; 52a, an InGaAs layer containing n-type impurities at a high concentration; 57a, an intermediate InGaAs layer; and 58a, p-type layer consisting of InGaAs containing p-type impurities at a high concentration. The n-type layer 52a, the intermediate layer 57a, and the p-type layer 58a constitute a Pin photodiode.

Referring to FIG. 4, reference numeral 61 denotes an emitter electrode formed on the emitter contact layer 60; 62, a base electrode formed on the base layer 58; 63, a collector electrode formed on the collector contact layer 52; 62a, an ohmic electrode formed on the p-type layer 58a; and 63a, an ohmic electrode formed on the n-type layer 52a. In this case, the collector contact layer 52 and the n-type layer 52a, the collector layer 57 and the intermediate layer 57a, and the p-type base layer 58 and the p-type layer 58a are, respectively, simultaneously formed by epitaxial growth. In addition, the base electrode 62 and the ohmic electrode 62a, and the collector electrode 63 and the ohmic electrode 63a, respectively, are simultaneously formed.

In this manner, the heterojunction bipolar transistor and the photodiode are formed on the same substrate.

The photoreceiver opto-electro integrated circuit with the above Arrangement has not only a serious problem of the low collector breakdown voltage as described above, but also the following problem.

In an integrated circuit implemented with a pin photodiode which is formed on the same semiconductor substrate using the base layer, collector layer, and collector contact layer of the heterojunction bipolar transistor, the response speed of an photo-excitation current of a photodiode with respect to incident light is not easily increased due to the following reason. That is, the incident light reaches the n-type layer deeper than the intermediate layer to generate electron-hole carrier pairs in the n-type layer, and the holes contribute to the photo-excitation current of the photodiode.

The response of the photodiode is delayed because of the transit time of the holes generated in the deep portion of the collector contact layer (n-type layer) to the base layer by diffusion or drifting.

In this state, even if a photoreceiver opto-electro integrated circuit is realized by forming a photodiode on the substrate on which the electronic circuit is formed, and an electronic circuit operates at a high speed, the response speed of the photodiode is low. For this reason, the operation speed of the integrated circuit cannot be easily increased.

SUMMARY OF THE INVENTION

It is, therefore, a principal object of the present invention to provide a heterojunction bipolar transistor which can be operated at a high speed and can increase a collector breakdown voltage.

It is another object of the present invention to provide an integrated circuit device in which the operation of a photoreceiver opto-electro integrated circuit constituted by a Pin photodiode and a heterojunction bipolar transistor which are formed on the same substrate can be performed at a high speed.

In order to achieve the above objects, according to an aspect of the present invention, there is provided a heterojunction bipolar transistor comprising a collector contact layer constituted by a first semiconductor layer formed on a semiconductor substrate and containing an impurity of a first conductivity type at a high concentration, a collector region stacked on the collector contact layer, a base layer constituted by a fifth semiconductor layer of a second conductivity type formed on the collector region, and an emitter layer constituted by a semiconductor layer of the first conductivity type formed on the base layer, wherein the collector region is constituted by a second semiconductor layer, a third semiconductor layer of the second conductivity type having an impurity concentration higher than that of the second semiconductor layer, and a fourth semiconductor layer of the first conductivity type having a band gap energy larger than that of each of the first and second semiconductor layers and an impurity concentration higher than that of the second semiconductor layer and lower than that of the first semiconductor layer, and the fourth semiconductor layer, the third semiconductor layer, and the second semiconductor layer are sequentially formed on the collector contact layer in an order named.

According to another object of the present invention, there is provided a photoreceiver opto-electro integrated circuit constituted by heterojunction bipolar transistors and a pin photodiode on the same semiconductor substrate, the heterojunction bipolar transistor comprising a collector contact layer constituted by a first semiconductor layer of a first conductivity type and formed on the semiconductor substrate, a collector region stacked on the collector contact layer, a base layer constituted by a fifth semiconductor layer of a second conductivity type formed on the collector region, and an emitter layer constituted by a semiconductor layer of the first conductivity type formed on the base layer, the collector region being constituted by a second semiconductor layer, a third semiconductor layer of the second conductivity type having an impurity concentration higher than that of the second semiconductor layer, and a fourth semiconductor layer of the first conductivity type having a band gap energy higher than that of each of the first and second semiconductor layers and an impurity concentration higher than that of the second semiconductor layer, and the fourth semiconductor layer, the third semiconductor layer, and the second semiconductor layer being sequentially formed on the collector contact layer in an order named, and the pin photodiode comprising a first conductivity type layer constituted by the first semiconductor layer formed on the semiconductor substrate, an intermediate layer obtained by sequentially stacking the fourth semiconductor layer, the third semiconductor layer, and the second semiconductor layer on the first conductivity type layer in an order named, and a second conductivity type layer constituted by the fifth semiconductor layer formed on the intermediate layer.

DESCRIPTION OF THE PREFERRED EMBODIMENTS

Embodiments of the present invention will be described below with reference to the accompanying drawings.

First Embodiment

Figures 1A, 1B:
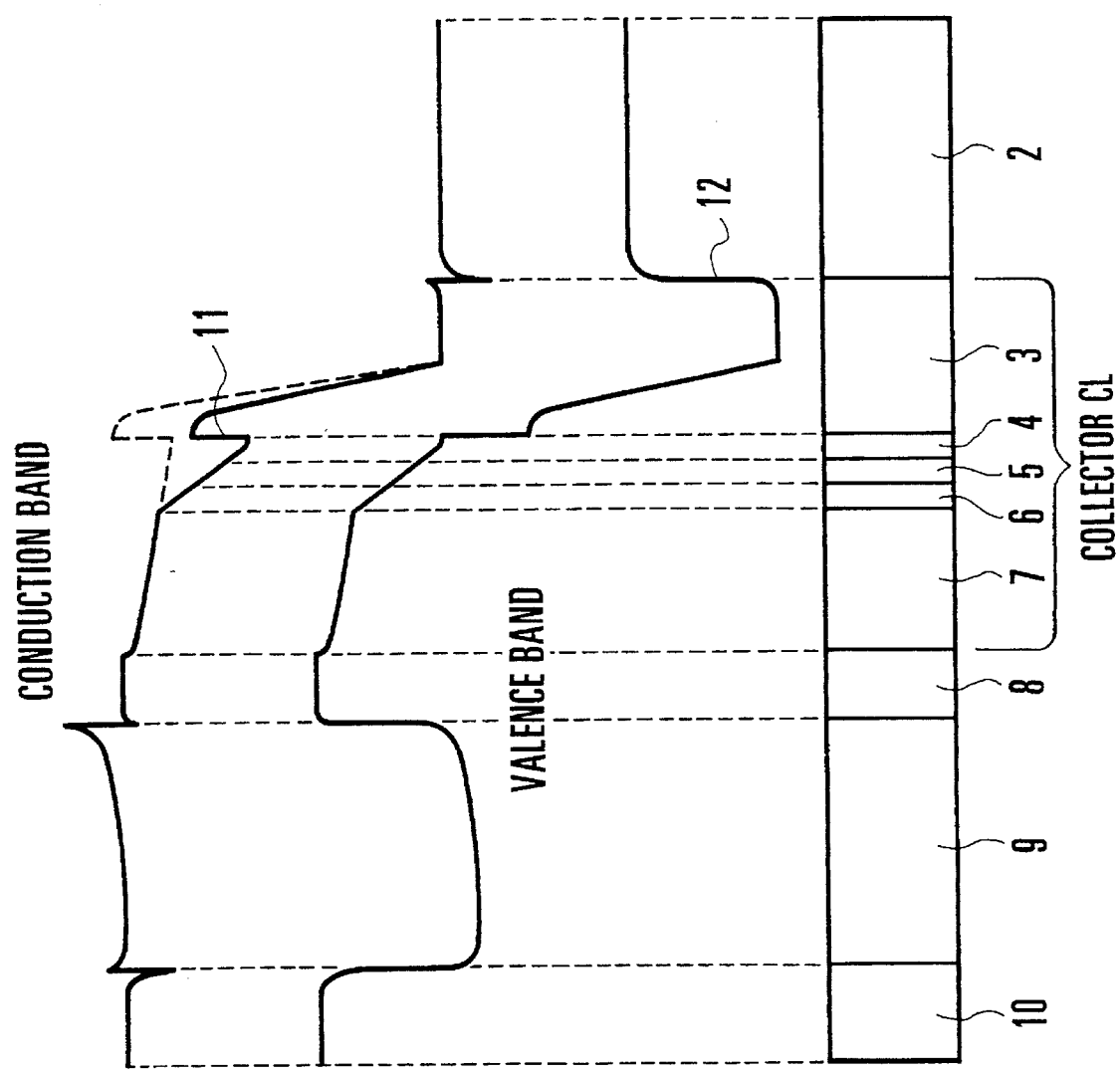
FIGS. 1A and 1B are views respectively showing the energy band diagram and layer structure of a heterojunction bipolar transistor according to the first embodiment of the present invention.

FIGS. 1A and 1B respectively show the energy band diagram and layer structure of a heterojunction bipolar transistor according to the first embodiment of the present invention.

Referring to FIG. 1, reference numeral 2 denotes a collector contact layer consisting of InGaAs containing n-type impurities at a high concentration and formed on a semi-insulating InP substrate; 3, a collector layer (fourth semiconductor layer) consisting of InP containing an n-type impurity; 4, a thin collector layer consisting of InGaAs containing n-type impurities at a high concentration; 5, a thin collector layer consisting of undoped InGaAs; 6, a thin collector layer (third semiconductor layer) consisting of InGaAs containing p-type impurities at a high concentration; and 7, a collector layer (second semiconductor layer) consisting of undoped InGaAs.

Reference numeral 8 denotes a base layer consisting of InGaAs containing p-type impurities at a high concentration; 9, an emitter layer consisting of InP containing n-type impurities; and 10, an emitter contact layer consisting of InGaAs containing n-type impurities at a high concentration. Note that the collector layers 3, 4, 5, 6, and 7 constitute a collector CL.

Note that reference numeral 11 denotes a discontinuity of a conduction band, and 12 denotes a discontinuity of a valence band.

In this case, the thin collector layers 4 and 6 consisting of InGaAs reduce the influence of the discontinuity 11 of the conduction band formed at the heterojunction interface between InGaAs and InP. That is, when the discontinuity 11 is continuously present from the collector layer 7, the discontinuity 11 serves as a barrier for electrons flowing from the base layer 8 to the collector contact layer 2.

When the thin collector layers 4 and 6 are inserted, the energy level of the discontinuity 11 can be lowered, and the effective height of the barrier for electrons can be advantageously decreased.

In addition, the thin collector layer 5 advantageously suppresses the diffusion of the impurities of the thin collector layer 6 and the thin collector layer 4 during crystal growth or device fabrication processes.

As shown in FIG. 1A, in this structure, most of the potential change in the collector CL is set in InP (collector layer 3) with a high band gap energy, thereby assuring a high collector breakdown voltage.

In addition, voltage drop in the collector layer 7 is set to be small as in a BCT structure.

In this manner, since electrons travel through Γ bands in most regions of the collector CL, the transit time of electrons in the collector CL is shortened.

As described above, in the heterojunction bipolar transistor according to the first embodiment, the collector CL has a BCT structure, and the transit time of carriers in the collector CL is shortened.

Since a portion which is near the interface between the collector layer and the collector contact layer and to which a strong electric field is applied is constituted by a semiconductor layer having a high band gap energy, a collector breakdown voltage considerably increases.

In the first embodiment described above, although undoped InGaAs is used as the material of the collector layer 7, the material of the collector layer 7 is not limited to this InGaAs.

The collector layer 7 may be formed using InGaAs containing an n- or p-type impurity at a concentration lower than that of the p-InGaAs of the base layer 8.

A thin layer consisting of InGaAs containing an n-type impurity at a high concentration may be inserted between the collector layer 7 and the base layer 8 to suppress the base widening effect caused by space charges in the operation of a transistor at a high current density.

The minimum thickness of the collector layer 7 adjacent to the base layer 8 is not easily quantitatively determined from the viewpoint of a reduction in a current blocking effect. According to an experiment, a thickness of 40 nm is insufficient, and a thickness of at least about 100 nm may be required as the minimum thickness.

The layer structure may be changed without departing from the spirit and scope of the present invention. For example, the collector contact layer 2 may consist of InP.

According to the above structure of the first embodiment, large part of the collector CL consists of InGaAs to improve the carrier transport properties, a high collector breakdown voltage is assured, and a current blocking effect is sufficiently suppressed.

Second Embodiment

Figure 2:
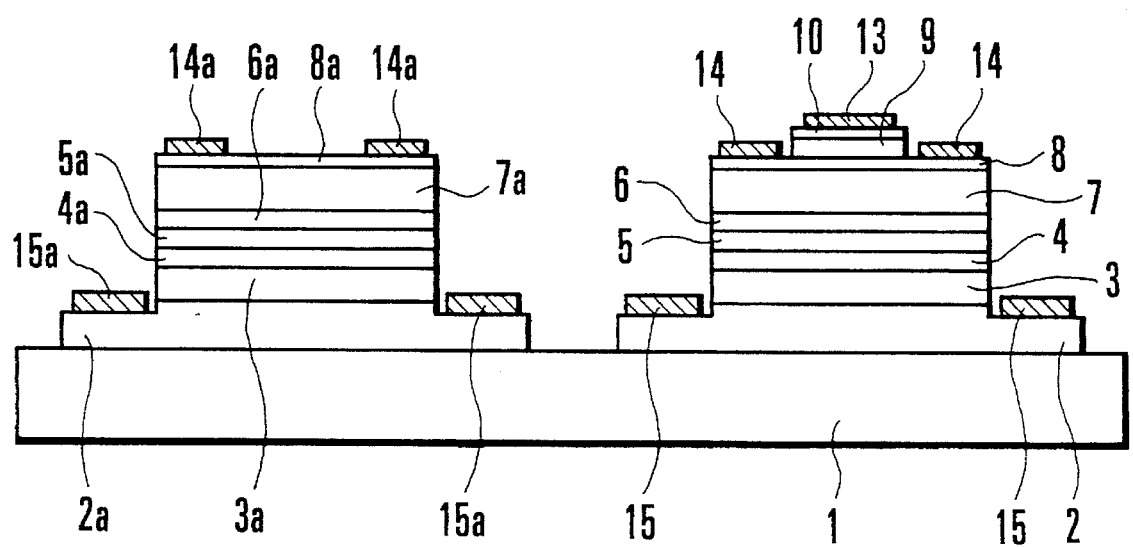
FIG. 2 is a sectional view showing the arrangement of a photoreceiver opto-electro integrated circuit according to the second embodiment of the present invention.
Figures 3A, 3B:
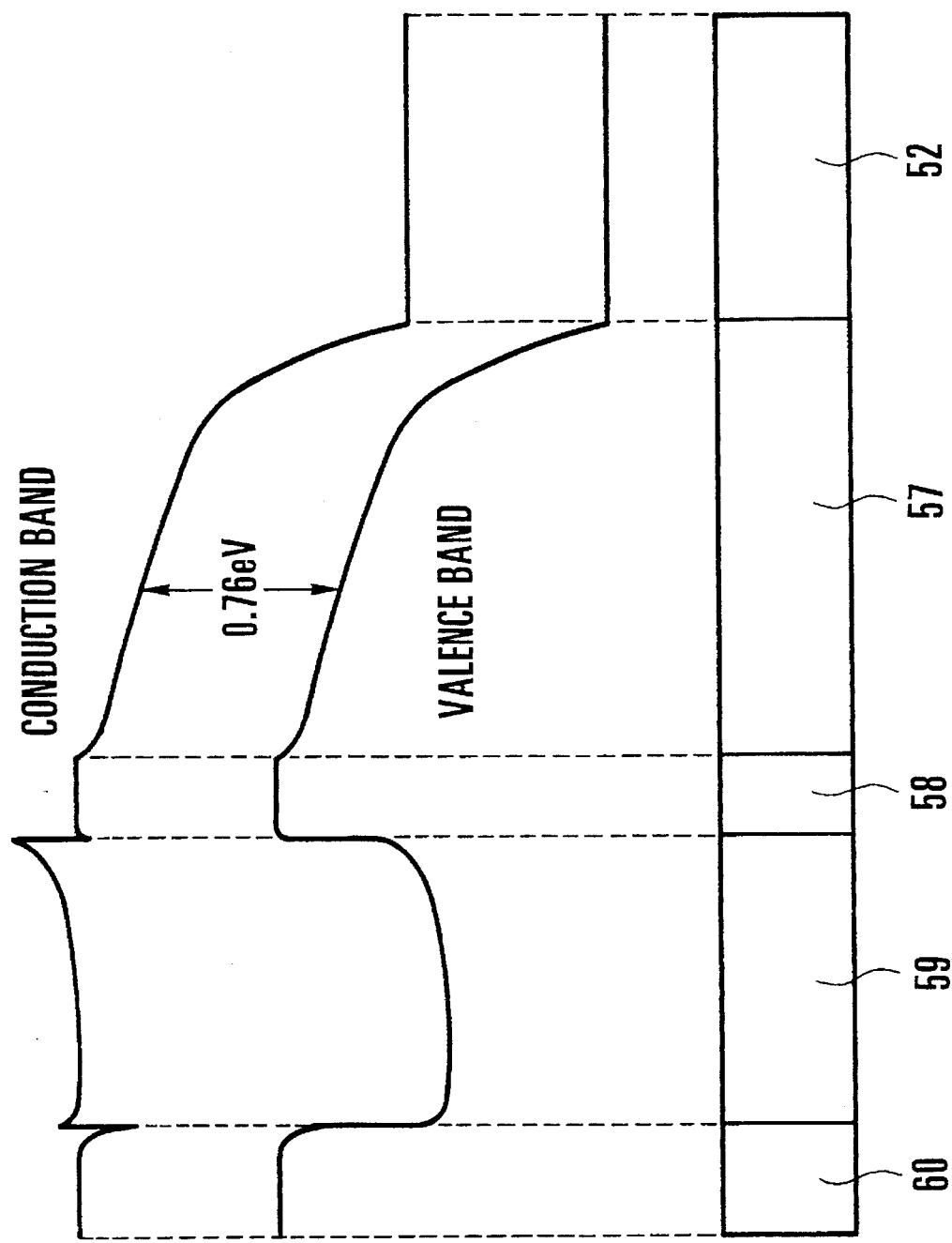
FIGS. 3A and 3B are views respectively showing the energy band diagram and layer structure of a conventional bipolar transistor.
Figure 4:
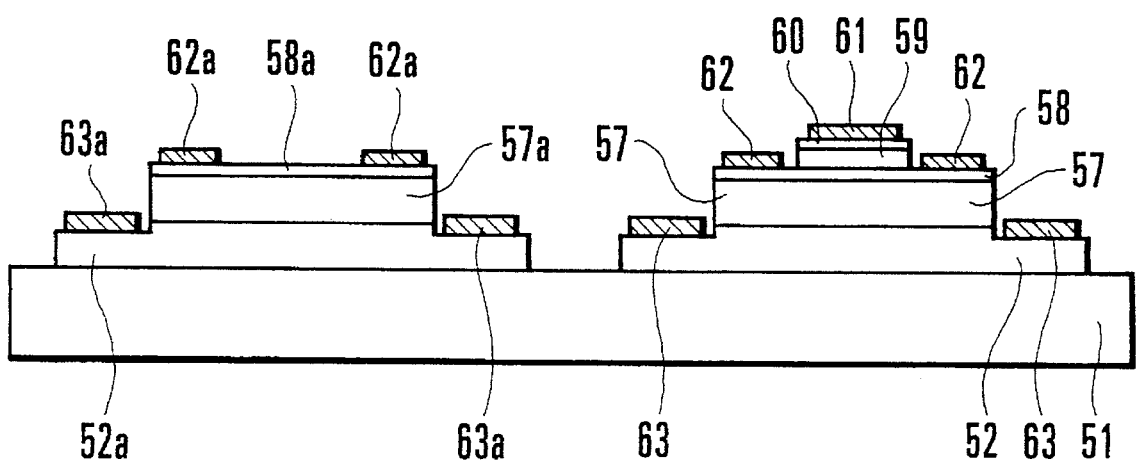
FIG. 4 is a sectional view showing the arrangement of a photoreceiver opto-electro integrated circuit constituted by the conventional heterojunction bipolar transistor and a pin photodiode.
Figures 5A, 5B:
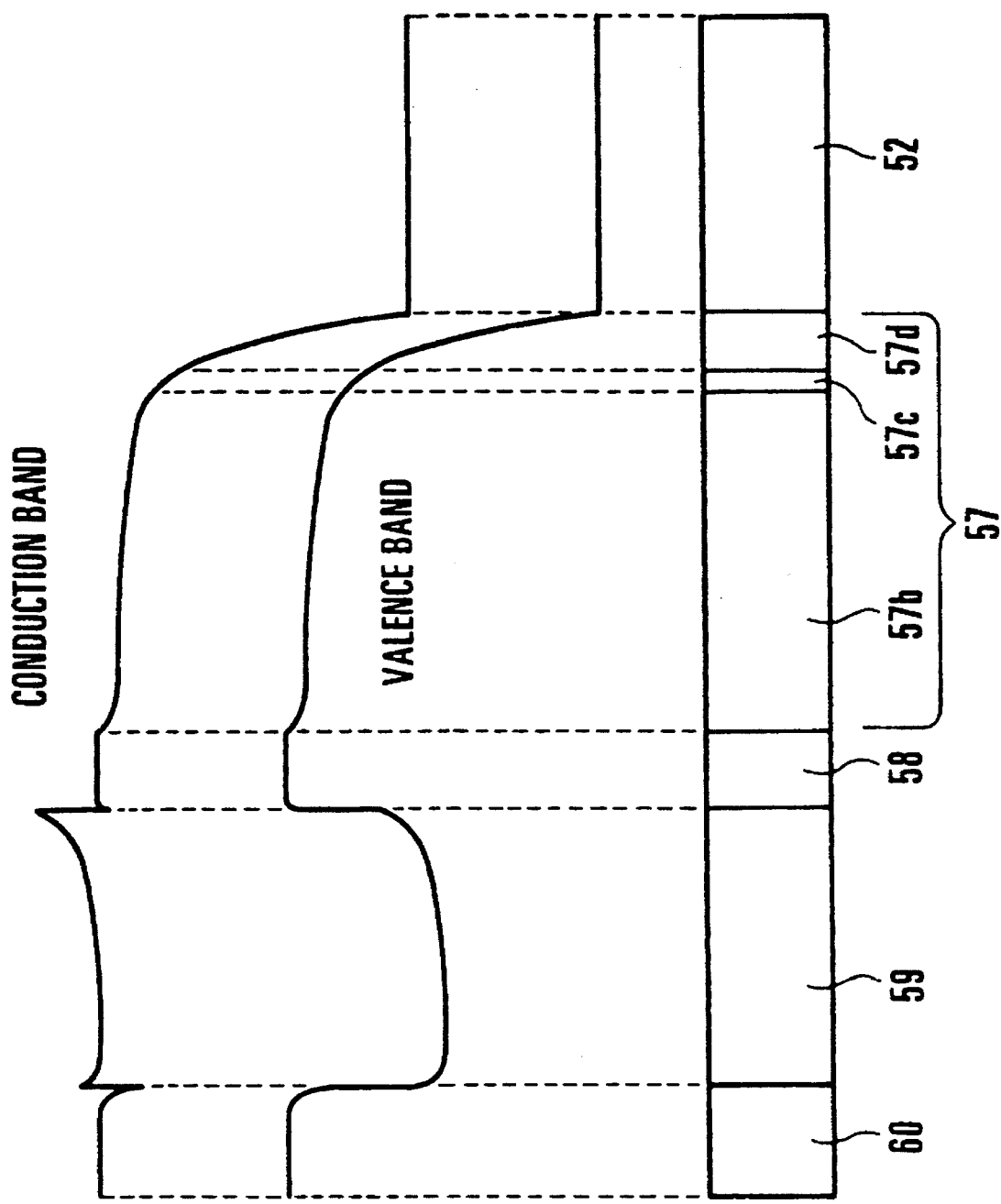
FIGS. 5A and 5B are views respectively showing the energy band diagram and layer structure of a conventional heterojunction bipolar transistor using a BCT structure as a collector.

FIG. 2 shows the arrangement of a photoreceiver optoelectro integrated circuit according to the second embodiment of the present invention.

Referring to FIG. 2, reference numeral 1 denotes a substrate consisting of semi-insulating InP; 2a, an InGaAs layer containing n-type impurities at a high concentration; 3a, an InP layer containing n-type impurities; 4a, a thin InGaAs layer containing n-type impurities at a high concentration; 5a, a thin undoped InGaAs layer; 6a, a thin InGaAs layer containing p-type impurities at a high concentration; 7a, an intermediate undoped InGaAs layer; and 8a, an InGaAs layer containing p-type impurities at a high concentration.

Reference numeral 13 denotes an emitter electrode formed on an emitter contact layer 10; 14, a base electrode formed on a base layer 8; 15, a collector electrode formed on a collector contact layer 2; 14a, an ohmic electrode formed on the p-type layer 8a; and 15a, an ohmic electrode formed on the n-type layer 2a.

The n-type layer 2a, the intermediate layer 3a, the thin intermediate layers 4a to 6a, the intermediate layer 7a, and the p-type layer 8a constitute a pin photodiode, so the heterojunction bipolar transistor and the pin photodiode are formed on the same substrate. The same reference numerals as in FIG. 1B denote the same parts in FIG. 2.

Referring to FIG. 2, the collector contact layer 2 and the n-type layer 2a, the collector layer 3 and the intermediate layer 3a, the thin collector layer 4 and the thin intermediate layer 4a, the thin collector layer 5 and the thin intermediate layer 5a, the thin collector layer 6 and the thin intermediate layer 6a, the collector layer 7 and the intermediate layer 7a, and the base layer 8 and the p-type layer 8a are, respectively, simultaneously formed.

In addition, the base electrode 14 and the ohmic electrode 14a, and the collector electrode 15 and the ohmic electrode 15a are, respectively, simultaneously formed.

All layers with numerals 2 to 10 are formed by epitaxial growth. Predetermined regions of these deposited layers are etched using photoresists as masks to form the mesas.

For example, an emitter mesa region as shown in the right of FIG. 2, which includes the emitter contact layer 10 and the emitter layer 9 of the heterojunction bipolar transistor, is formed by etching with a patterned photoresist mask.

During this mesa etching procedure, the region of the pin photodiode shown on the left of FIG. 2, is exposed without forming a mask to reveal the p-type layer 8a.

Thereafter, when the processes for fabricating the heterojunction bipolar transistor are also performed to a region for forming the pin photodiode, the heterojunction bipolar transistor and the pin photodiode can be fabricated simultaneously.

In the pin photodiode according to this embodiment, the intermediate layer 3a consists of InP with a high band gap energy, and the n-type layer 2a consists of InGaAs with a low band gap energy.

Therefore, as shown in FIG. 1A, a discontinuity 12 of a valence band is formed on the heterojunction interface of the intermediate layer 3a and the n-type layer 2a. This discontinuity 12 operates as a barrier for holes generated by photo-excitation in the layer 2a. Therefore, the holes generated in the layer 2a do not contribute to a photo-excitation current of the pin photodiode. For example, when a 1.3-µm or 1.55-µm wavelength is used for the incident light to the pin photodiode, no electron-hole pairs are generated in the intermediate layer 3a. Therefore, the response speed of this pin photodiode can be considerably increased compared with that of a conventional pin photodiode.

When the thickness of the collector layer 7 or 7a in contact with the base layer is considered from the viewpoint of formation of the pin photodiode, this thickness is determined by the demand of the sensitivity of the photodiode. Assuming that the absorption coefficient of InGaAs for light with a 1.55-mm wavelength is $0.68 \times 10^4$/cm, the thickness of the collector layer 7 or 7a must be set to be about 200 nm or more to obtain a photo-excitation current of 0.1 A/W or more.

As described above, according to the present invention, the transit time of electrons in the collector is shortened, and an effect that a collector breakdown voltage considerably increases is obtained. Therefore, the bipolar transistor according to the present invention is variously applied as a transistor for an ultrahigh-speed.high-frequency integrated circuit or a transistor for amplifying RF power.

In addition, in the photoreceiver opto-electro integrated circuit according to the present invention, an effect that the response speed of the pin photodiode is increased can be obtained. Therefore, the photoreceiver opto-electro integrated circuit operates at a high speed.

The pin photodiode can be fabricated simultaneously with a heterojunction bipolar transistor without any special process.

Finally, the structure according to the present invention will be compared with various conventionally proposed structures with reference to FIGS. 6A to 6D.

Figure 6A:
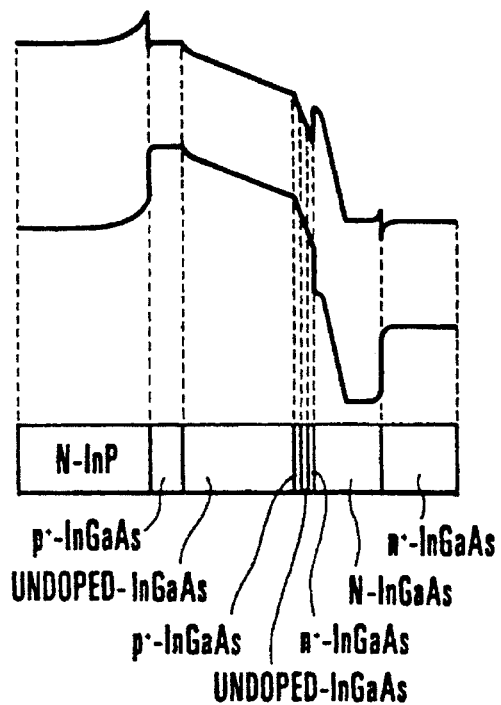
FIGS. 6A to 6D are views respectively showing the energy band diagrams and layer structures of heterojunction bipolar transistors to compare the present invention with conventional techniques.

FIG. 6A shows the basic structure of the present invention and corresponds to FIGS. 1A and 1B.

In the structure according to the present invention, as described above, most part of the collector CL consists of InGaAs so as to improve the electron transport, a high collector breakdown voltage can be assured, and a current blocking effect can be sufficiently suppressed.

Figure 6B:
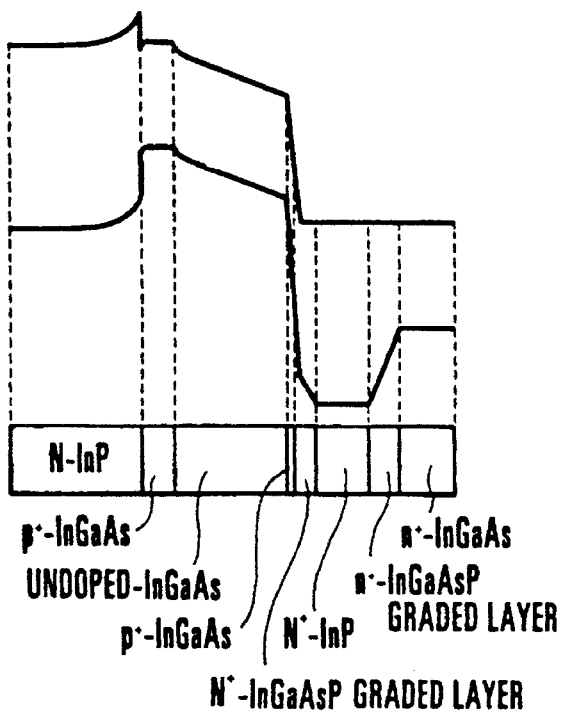

FIG. 6B shows, for example, as described in Japanese Patent Laid-Open No. 4-127534 (published on Apr. 28, 1992), a case wherein a collector has a structure of thick undoped InGaAs/thin $p^+$-InGaAs/$n^+$-InGaAsP (graded)/$n^+$-InP. In this structure, suppression of a current blocking effect can be achieved as in the present invention. However, an increase in collector voltage does not cause a depletion layer to extend. For this reason, an electric field is concentrated (band gap is small) near $P^+$-InGaAs/$n^+$-InGaAsP, and a collector breakdown voltage cannot be assured. In addition, since this structure is a four-element graded structure, gradation cannot be easily controlled, and a four-element layer cannot be easily etched.

Figure 6C:
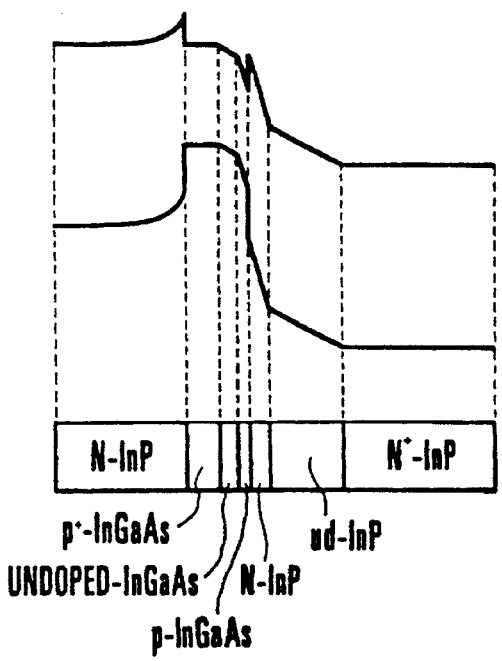

FIG. 6C shows, for example, as described in Japanese Patent Laid-Open No. 4-245439 (published on Sep. 2, 1992), a case wherein a collector has a structure of thin undoped InGaAs/thin p-InGaAs/thin n-InP/undoped InP. In this structure, InGaAs is present only in a region near the base layer, and the electron energy in this region is low, thereby minimizing the ionization in the InGaAs. In addition, an end of a collector depletion layer is certainly in InP.

At a condition of high current density and a high collector voltage, an electric field tends to become strong near the end of the depletion layer, i.e., in the InP. For this reason, this structure has a high collector breakdown voltage. However, undoped InGaAs adjacent to the base layer is thin, and a notch is formed between p-InGaAs and n-InP. For these reasons, a current blocking effect cannot be sufficiently suppressed. In addition, the InGaAs layer is too thin to be used as a photo-absorption layer of a photodiode. So it is impossible to fabricate a photoreceiver opto-electro integrated circuit using this structure. Moreover, in this structure, since large part of the collector depletion layer is occupied by InP with an electron transport properties inferior to that of InGaAs, the operation speed is lower than that of the present invention.

Figure 6D:
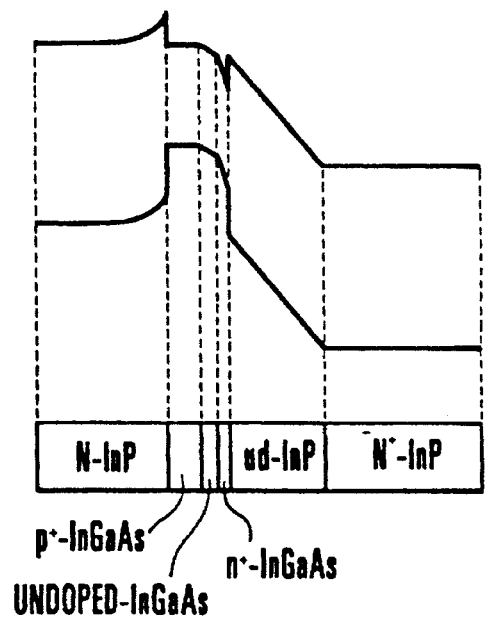

FIG. 6D shows, for example, as described in Japanese Patent Laid-Open No. 4-221834 (published on Aug. 12, 1992), a case wherein a collector has a structure of thin undoped InGaAs/thin $n^+$-InGaAs/undoped InP. The feature of this structure are the same as those of FIG. 6C.

What is claimed is:

1. A semiconductor integrated circuit device comprising:

a photoreceiver opto-electro integrated circuit obtained by forming a heterojunction bipolar transistor on a first portion of a semiconductor substrate; and a pin photodiode formed on a second portion of the semiconductor substrate, said heterojunction bipolar transistor comprising:
a collector contact having a first semiconductor layer of a first conductivity type and formed on said first portion of the semiconductor substrate;
a collector region stacked on said collector contact,
a base having a second semiconductor layer of a second conductivity type formed on said collector region, and
an emitter having a semiconductor layer of the first conductivity type formed on said base layer, said collector region including:
a third semiconductor layer,
a fourth semiconductor layer of the second conductivity type having an impurity concentration higher than that of said third semiconductor layer, and
a fifth semiconductor layer of the first conductivity type having a band gap energy higher than that of each of said first and third semiconductor layers and an impurity concentration larger than that of said third semiconductor layer, and lower than that of said first semiconductor layer,
wherein said fifth semiconductor layer, said fourth semiconductor layer, and said third semiconductor layer are sequentially formed on said collector contact, said pin photodiode comprising:

said first semiconductor layer of the first conductivity type formed on said second portion of the semiconductor substrate, an intermediate layer obtained by sequentially stacking said fifth semiconductor layer, said fourth semiconductor layer, and said third semiconductor layer on said first semiconductor layer, and said second semiconductor layer of the second conductivity type formed on said intermediate layer.

\* \* \* \* \*